(12) United States Patent
Wang et al.

(10) Patent No.: US 11,232,276 B2
(45) Date of Patent: Jan. 25, 2022

(54) FINGERPRINT DETECTION TOUCH CONTROL DISPLAY APPARATUS, ARRAY SUBSTRATE, AND METHOD OF FABRICATING FINGERPRINT DETECTION TOUCH CONTROL DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yang Wang, Beijing (CN); Guoqiang Tang, Beijing (CN); Yingsong Xu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 426 days.

(21) Appl. No.: 16/345,952

(22) PCT Filed: Nov. 19, 2018

(86) PCT No.: PCT/CN2018/116178
§ 371 (c)(1),
(2) Date: Apr. 29, 2019

(87) PCT Pub. No.: WO2019/214206
PCT Pub. Date: Nov. 14, 2019

(65) Prior Publication Data
US 2021/0326554 A1 Oct. 21, 2021

(30) Foreign Application Priority Data
May 9, 2018 (CN) .......................... 201810438740.1

(51) Int. Cl.
*G06K 9/00* (2006.01)
*G06F 3/041* (2006.01)
*G06F 1/3231* (2019.01)

(52) U.S. Cl.
CPC ......... *G06K 9/0004* (2013.01); *G06F 1/3231* (2013.01); *G06F 3/0412* (2013.01); *G06K 9/00013* (2013.01); *G06K 2009/0006* (2013.01)

(58) Field of Classification Search
CPC ............. G06K 9/0004; G06K 9/00013; G06K 9/0008; G06K 2009/0006; G06F 1/3231;
(Continued)

(56) References Cited

U.S. PATENT DOCUMENTS

2015/0331508 A1* 11/2015 Nho ....................... G06F 3/0445
345/173
2016/0266695 A1 9/2016 Bae et al.
(Continued)

FOREIGN PATENT DOCUMENTS

| CN | 103325339 A | 9/2013 |
| CN | 203232681 U | 10/2013 |

(Continued)

OTHER PUBLICATIONS

International Search Report & Written Opinion dated Feb. 20, 2019, regarding PCT/CN2018/116178.
(Continued)

*Primary Examiner* — Abhishek Sarma
(74) *Attorney, Agent, or Firm* — Intellectual Valley Law, P.C.

(57) ABSTRACT

A fingerprint detection touch control display apparatus. The fingerprint detection touch control display apparatus includes a base substrate; a plurality of touch sensors on the base substrate; and a counter substrate facing the base
(Continued)

substrate. Each of the plurality of touch sensors includes an invisible tight emitting element; a driving circuit configured to driving light emission of tire divisible light emitting element; an invisible light sensor; and a light shield. The invisible light emitting element is configured to emit light toward the counter substrate, at least a portion of the light being reflected by a touch object on the counter substrate into the invisible light sensor through a via extending through the light shield. The invisible light sensor is configured to detect tire portion of the light, thereby detecting a fingerprint information.

19 Claims, 6 Drawing Sheets

(58) Field of Classification Search
CPC ... G06F 3/0412; G06F 3/0421; H01L 27/323; H01L 27/3234; H01L 51/5253; H01L 51/5281; H01L 27/3244; G02B 27/30; G02B 2207/123
See application file for complete search history.

(56) References Cited

U.S. PATENT DOCUMENTS

| | | | |
|---|---|---|---|
| 2017/0316248 A1* | 11/2017 | He | G06K 9/00013 |
| 2018/0046836 A1 | 2/2018 | Hinger | |
| 2018/0096186 A1 | 4/2018 | Mienko et al. | |
| 2018/0211085 A1 | 7/2018 | Liu et al. | |
| 2019/0026523 A1* | 1/2019 | Shen | G02B 6/4203 |
| 2019/0050621 A1 | 2/2019 | Xu et al. | |
| 2019/0156097 A1 | 5/2019 | Liu et al. | |
| 2020/0193120 A1* | 6/2020 | Chen | H01L 27/323 |

FOREIGN PATENT DOCUMENTS

| | | |
|---|---|---|
| CN | 105512650 A | 4/2016 |
| CN | 105678255 A | 6/2016 |
| CN | 106298859 A | 1/2017 |
| CN | 106778485 A | 5/2017 |
| CN | 106886767 A | 6/2017 |
| CN | 106971173 A | 7/2017 |
| CN | 107908310 A | 4/2018 |
| CN | 107958194 A | 4/2018 |
| WO | 2016144108 A1 | 9/2016 |
| WO | 2018031173 A1 | 2/2018 |

OTHER PUBLICATIONS

First Office Action in the Chinese Patent Application No. 201810438740.1, dated May 14, 2020; English translation attached.

* cited by examiner

| R | G |
|---|---|
| B | 20 |

FIG. 10

| R | G | B | 20 |
|---|---|---|----|

FIG. 11

| R | 20 | G | B |
|---|----|---|---|

FIG. 12

FINGERPRINT DETECTION TOUCH CONTROL DISPLAY APPARATUS, ARRAY SUBSTRATE, AND METHOD OF FABRICATING FINGERPRINT DETECTION TOUCH CONTROL DISPLAY APPARATUS

CROSS-REFERENCE TO RELATED APPLICATION

This application is a national stage application under 35 U.S.C. § 371 of International Application No. PCT/CN2018/116178, filed Nov. 19, 2018, which claims priority to Chinese Patent Application No. 201810438740.1, filed May 9, 2018, the contents of which are incorporated by reference in the entirety.

TECHNICAL FIELD

The present invention relates to display technology, more particularly, to a fingerprint detection touch control display apparatus, an array substrate, and a method of fabricating a fingerprint detection touch control display apparatus.

BACKGROUND

In recent yeas, various methods have been proposed in fingerprint and palm print recognition. Examples of optical method for recognizing fingerprint and palm print include total reflection method, light-path separation method, and scanning method. In a total reflection method, light from a light source such as ambient light enters into a pixel, and is totally reflected on the surface of a package substrate. When a finger or palm touches the display panel, the total reflection condition of the surface changes locally upon touch, leading to a disruption of the total reflection locally. The disruption of the total reflection results in a reduced reflection. Based on this principle, the ridge lines of a finger may be differentiated from the valley lines. Alternatively, fingerprint and palm print may be recognized by detecting changes in capacitance when a finger or palm touches the display panel.

SUMMARY

In one aspect, the present invention provides a fingerprint detection touch control display apparatus, comprising a base substrate; a plurality of touch sensors on the base substrate; and a counter substrate facing the base substrate; wherein each of the plurality of touch sensors comprises an invisible light emitting element; a driving circuit configured to driving light emmission of the invisible light emitting element; an invisible light sensor; and a light shield; and wherein the invisible light emitting element is configured to emit light toward the counter substrate, at least a portion of the light being reflected by a touch object on the counter substrate into the invisible light sensor through a via extending through the light shield; and the invisible light sensor is configured to detect the portion of the light, thereby detecting a fingerprint information.

Optionally, the invisible light emitting element comprises a first electrode; an invisible light emitting layer on the fit electrode; and a second electrode on a side of the light emitting layer away from the first electrode wherein the light shield is in a same layer as the first electrode and made of a same material.

Optionally, the second electrode is a common electrode for the plurality of touch sensors and configured to provide a common voltage level for the plurality of touch sensors; and the second electrode is absent in a region above the via.

Optionally, the invisible light sensor is at a position corresponding to the via; and an orthographic projection of the invisible light sensor on the base substrate is at least partially between an orthographic projection of the invisible light emitting element on the base substrate and an orthographic projection of the light shield on the base substrate.

Optionally, the invisible light sensor comprises a near infrared light detecting phototransistor comprising a first node connected to a sensor line, a second node connected to a first power supply terminal, and a gate node connected to a touch control signal terminal.

Optionally, the phototransistor further comprises an active layer made of a material selected from a group consisting of gallium nitride (GaN), gallium arsenide (GaAs), indium phosphide (InP), and germanium silicon (GeSi).

Optionally, the invisible light emitting element is an infrared light emitting element or a near infrared light emitting element.

Optionally, the driving circuit comprises a driving transistor comprising a first node connected to a first power supply terminal, a second node connected to the invisible light emitting element, and a gate node connected to a data line.

Optionally, the driving circuit further comprises a switching transistor, a light emission control transistor, a reset transistor, a first storage capacitor, and a second storage capacitor; wherein the switching transistor comprises a first node connected to the data line, a second node connected to the gate node of the driving transistor, and a gate node connected to a gate line; the light emission control transistor comprises a first node connected to the first power supply terminal, a second node connected to the first node of the driving transistor, and a gate node connected to an emission control line; the reset transistor comprises a first node connected to the second node of the driving transistor, a second node connected to a signal input terminal, and a gate node connected to a reset signal terminal; the first storage capacitor comprises a first terminal connected to the gate node of the driving transistor, and a second terminal connected to the second node of the driving transistor; and the second storage capacitor comprises a first terminal connected to the first node of the reset transistor, and a second terminal connected to a second power supply terminal.

Optionally, the fingerprint detection touch control display apparatus further comprises an operational amplification circuit configured to amplify an electrical signal generated by the invisible light sensor upon receiving the portion of the light.

Optionally, the operational amplification circuit comprises sampling switch transistor, a reference resistor, a variable acquisition switching transistor, an integrating capacitor, an operational amplifier, a third storage capacitor, and a reset switching transistor; wherein the sampling switch transistor comprises a first node connected to the invisible light sensor, a second node connected to a first terminal of the reference resistor, and a gate node connected to a sampling control signal terminal; the reference resistor comprises a first terminal connected to the second node of the sampling switch transistor, and a second terminal connected to an inverting input terminal of the operational amplifier; the variable acquisition switching transistor comprises a first node connected to the inverting input terminal of the operational amplifier and a first terminal of the integrating capacitor, a second node connected to an output terminal of the operational amplifier and a second terminal of the integrating capacitor, and a gate node connected to a variable acquisition control terminal; the reset switching transistor comprises a first node connected to a non-inverting input terminal of the operational amplifier and a first terminal of the third storage capacitor, a second node connected to the output terminal of the operational amplifier, and a gate node connected to a reset control terminal; and the third storage capacitor comprises a first terminal connected to the first node of the reset switching transistor, and a second terminal connected to a second power supply terminal.

Optionally, the fingerprint detection touch control display apparatus comprises a plurality of pixels; wherein the plurality of touch sensors m disposed in multiple ones of the plurality of pixels.

Optionally, the fingerprint detection touch control display apparatus further comprises a memory; and one or more processors; wherein the memory and the one or more processors are connected with each other and the memory stores computer-executable instructions for controlling the one or more processors to monitor an image display status of the fingerprint detection touch control display apparatus; and recognize a fingerprint of a touch object.

Optionally, when the fingerprint detection touch control display apparatus is detected to be in a sleep state, the memory further stores computer-executable instructions for controlling the one or more processors to wake up the fingerprint detection touch control display apparatus and recognize the fingerprint of the touch object; and when the fingerprint detection touch control display apparatus is detected to be in an image display stat the memory further stores computer-executable instructions for controlling the one or more processors to recognize the fingerprint of the touch object based on an electrical signal generated by the invisible light sensor upon receiving the portion of the light.

Optionally, the memory further stores computer-executable instructions for controlling the one or more processors to adjust a refresh frequency of the fingerprint detection touch control display apparatus.

Optionally, when the fingerprint detection touch control display apparatus is detected to be in a sleep state, the memory further stores computer-executable instructions for controlling the one or more processors to set the refresh frequency of the fingerprint detection touch control display apparatus to a first refresh frequency; and when the fingerprint detection touch control display apparatus is detected to be in an image display state, the memory further stores computer-executable instructions for controlling the one or more processors to set the refresh frequency of the fingerprint detection touch control display apparatus to a second refresh frequency greater than the first refresh frequency.

In another aspect, the present invention provides a method of fabricating a fingerprint detection touch control display apparatus, comprising forming a plurality of touch sensors on a base substrate; and forming a counter substrate facing the base substrate; wherein forming each of the plurality of touch sensors comprises forming an invisible light emitting element; forming a driving circuit configured to driving light emission of the invisible light emitting element; forming an invisible light sensor; forming a light shield; and forming a via extending through the light shield; wherein the invisible light emitting element is formed to emit light toward the counter substrate, at least a portion of the light being reflected by a touch object into the invisible light sensor through the via; and the invisible light sensor is formed to detect the portion of the light, thereby detecting a fingerprint information.

Optionally, forming the invisible light emitting element comprises forming a first electrode material, layer; patterning the first electrode material layer using a single mask plate to form a first electrode, the light shield, and the via, the light shield and the first electrode formed in a same layer using a single mask plate, and the via formed to extend through the light shield; forming an invisible light emitting layer on the first electrode; and forming a second electrode on a side of the light emitting layer away from the first electrode.

Optionally, forming the second electrode comprises depositing a second electrode material layer on a side of the light emitting layer away from the first electrode in an open mask process; and patterning the second electrode material layer to remove a portion of the second electrode material layer in a region above the via, thereby forming the second electrode.

In another aspect, the present invention provides array substrate, comprising a base substrate; and a plurality of touch sensors on the base substrate; wherein each of the plurality of touch sensors comprises an invisible light emitting element; a driving circuit configured to driving light emission of the invisible light emitting element; an invisible light sensor; and a light shield; and wherein the invisible light emitting element is configured to emit light, at least a portion of the light being reflected by a touch object into the invisible light sensor through a via extending through the light shield; and the invisible light sensor is configured to detect the portion of the light, thereby detecting a fingerprint information.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a fingerprint detection touch control display apparatus, an array substrate, and a method of fabricating a fingerprint detection touch control display apparatus that substantially obviate one or more of the problems due to limitations and disadvantages of the related art. In one aspect, the present disclosure provides a fingerprint detection touch control display apparatus. In some embodiments the fingerprint detection touch control display apparatus includes a base substrate; and a plurality of touch sensors on the base substrate; and a counter substrate facing the base substrate. Optionally, each of the plurality of touch sensor includes an invisible light emitting element; a driving circuit configured to driving light emission of the invisible light emitting element; an invisible light sensor and a light shield. Optionally, the invisible light emitting element is configured to emit light toward the counter substrate, at least a portion of the light being reflected by a touch object into the invisible light sensor through a via extending through the light shield. Optionally, the invisible light sensor is configured to detect the portion of the light, thereby detecting a fingerprint information.

Figure 1:
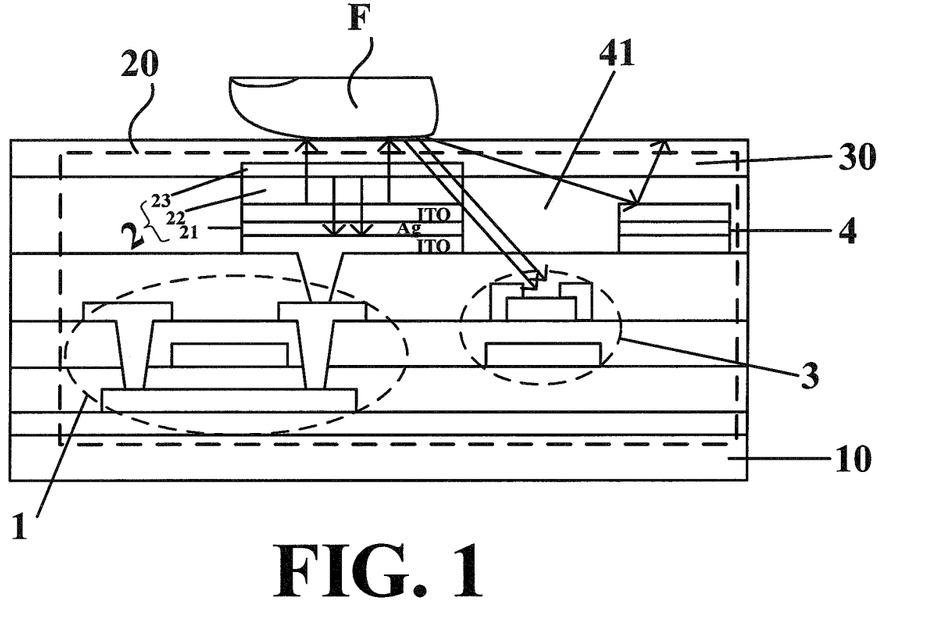
FIG. 1 is a diagram illustrating the structure of a fingerprint detection touch control display apparatus in some embodiments according to the present disclosure.
Figure 2:
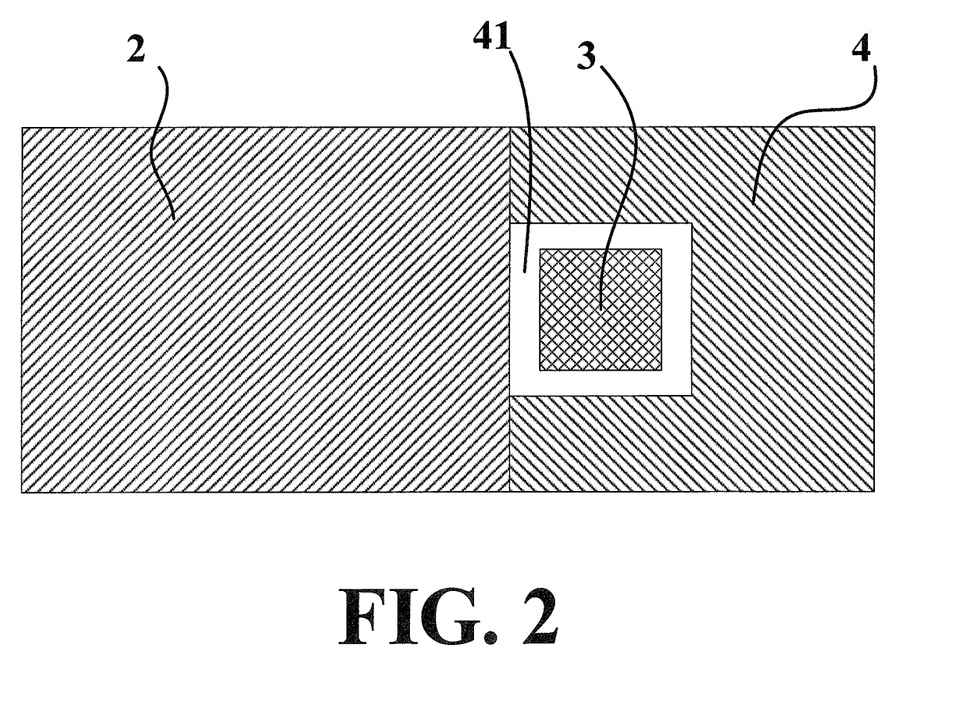
FIG. 2 is a plan view of an invisible light emitting element and a light shield of a touch sensor in FIG. 1.

FIG. 1 is a diagram illustrating the structure of a fingerprint detection touch control display apparatus in some embodiments according to the present disclosure. FIG. 2 is a plan view of an invisible light emitting element and a light shield of a touch sensor in FIG. 1. Referring to FIG. 1, the fingerprint detection touch control display apparatus in some embodiments includes a base substrate 10; and a plurality of touch sensors 20 on the base substrate 10; and a counter substrate 30 facing the base substrate 10. Each of the plurality of touch sensors 20 in some embodiments includes an invisible light emitting element 2; a driving circuit 1 configured to driving light emission of the invisible light emitting element 2; an invisible light sensor 3; and a light shield 4. Referring to FIG. 1 and FIG. 2, the invisible light emitting element 2 is configured to emit light toward the counter substrate 30, at least a portion of the light being reflected by a touch object F into the invisible light sensor 3 through a via 41 extending through the light shield 4. The invisible light sensor 3 is configured to detect the portion of the light reflected by the touch object F into the invisible light sensor 3 through the via 41. Upon receiving the portion of the light reflected by the touch object F into the invisible light sensor 3 through the via 41, the invisible light sensor 3 generates an electrical signal, thereby sensing a fingerprint information.

The light shield is substantially non-transparent with respect to the invisible light. As used herein, the term "substantially non-transparent" means at least 50 percent (e.g., at least 60 percent, at least 70 percent, at least 80 percent, at least 90 percent, and at least 95 percent) of an incident invisible light not transmitted therethrough, e.g., being blocked. The light shield 4 and the invisible light emitting element 2 thus form a path through which the portion of the light reflected by the touch object F is transmitted into the invisible light sensor 3. Any appropriate material may be provided in the via 41. Optionally, the via 41 is an empty space. Optionally, the via 41 is filled with a substantially transparent insulating material. As used herein, the term "substantially transparent" means at least 30 percent (e.g., at least 60 percent at least 70 percent, at least 80 percent, at least 90 percent, and at least 95 percent) of an incident invisible light transmitted therethrough.

The fingerprint detection touch control display apparatus according to the present disclosure is configured to detect any appropriate touch object, e.g., a finger, a too, a palm, as well as anon-human part object such as a touch object having ridges and valleys on its surface. Optionally, the touch object is a finger of a human. As used herein, the term "fingerprint" refers to specific patterns of ridges and valleys of a touch object such as a finger, a palm, and a toe.

In the present fingerprint detection touch control display apparatus, the invisible light sensor 3 is configured to receive the portion of the light reflected by the touch object F transmitted through the via 41 extending through the light shield 4, and is configured to generate an electrical signal upon receiving the portion of the light reflected by the touch object F, thereby sensing a fingerprint information. When a finger or palm touches the counter substrate, a ridge line reflects light differently from a valley line. Based on this principle, the ridge lines of a finger may be differentiated from the valley lines. By analyzing electrical signals generated in response to the light reflected by the ridge lines and the valley lines, the ridge line information and the valley line information can be obtained, thereby obtaining the fingerprint information.

Referring to FIG. 1, the invisible light emitting element 2 in some embodiments includes a first electrode 21, an invisible light emitting layer 22 on the first electrode 21, and a second electrode 23 on a side of the invisible light emitting layer 22 away from the first electrode 21. In some embodiments, the light shield 4 is in a same layer as the first electrode 21 and made of a same material as the first electrode 21. For example, the light shield 4 and the first electrode 21 can be formed in a same patterning process using a single mask plate and a same material. As used herein, the term "same layer" refers to the relationship between the layers simultaneously formed in the same step. In one example, the light shield 4 and the first electrode 21 are in a same layer when they are formed as a result of one or more steps of a same patterning process performed in a same layer of material. In another example, the light shield 4 and the first electrode 21 can be formed in a same layer by simultaneously performing the step of forming the light shield 4 and the step of forming the first electrode 21. The term "same layer" does not always mean that the thickness of the layer or the height of the layer in a cross-sectional view is the same.

In some embodiments, each of the first electrode 21 and the light shield 4 has a multiple-sublayer structure. Optionally, the multiple-sublayer structure includes a first substantially transparent conductive sublayer, a reflective conductive sublayer on the first substantially transparent conductive sublayer, and a second substantially transparent conductive sublayer on a side of the reflective conductive sublayer away from the first substantially transparent conductive sublayer. In one example, the multiple-sublayer structure includes a first indium oxide sublayer, a reflective silver sublayer on the first indium oxide sublayer, and a second indium oxide sublayer on a side of the reflective silver sublayer away from the first indium oxide sublayer. The reflective silver sublayer has a very high reflectivity, is configured to reflect invisible light emitted fam the invisible light emitting layer to a light emitting side of the fingerprint detection touch control display apparatus (e.g., along a direction from the base substrate 10 toward the counter substrate 30).

In some embodiments, the second electrode 23 is a common electrode for the plurality of touch sensors 20, and configured to provide a common voltage level for the plurality of touch sensors. Optionally, the second electrode 23 is a comma electrode for the plurality of touch sensors 20 as well as for a plurality of visible light emitting elements for image display, the common electrode configured to provide a common voltage level for the plurality of touch sensors and the plurality of visible light emitting elements. For example, the common electrode can be formed by depositing a conductive material layer on the base substrate in an open mask process, thus the common electrode is shared by the plurality of touch sensors 20 (and optionally further shared by the plurality of visible light emitting elements for image display). Optionally, the second electrode 23 extends substantially throughout an entire area the fingerprint detection touch control display apparatus. Optionally, the second electrode 23 is an integral electrode for the plurality of touch sensors 20.

During a touch event, a finger or palm touches the display panel, the total reflection condition of the surface changes locally upon touch, leading to a disruption of the total reflection locally. The disruption of the total reflection results in a reduced reflection. To achieve an enhanced sensitivity, in some embodiments, the second electrode 23 is absent in a region above the via 41. This allows as much a possible light reflected by the touch object F into the invisible light sensor 3 through the via 41. By having this design, the fingerprint information can be detected with enhanced sensitivity and accuracy. In one example, the second electrode 23 is an integral common electrode for the plurality of touch sensors 20, but is absent in the region above the via 41.

In some embodiments, the invisible light emitting layer 22 is outside the via 41. By having this design, light reflected by the touch object F ca be received by the invisible light sensor 3 as much as possible. In some embodiments, the invisible light sensor 3 is at a position corresponding to the via 41. Optionally, an orthographic projection of the invisible light sensor 3 on the base substrate 10 is at least partially between an orthographic projection of the invisible light emitting element 2 on the base substrate 10 and an orthographic projection of the light shield 4 on the base substrate 10. By having this design the invisible light sensor 3 can receive as much as possible light reflected by the touch object F, enhancing the sensitivity and accuracy in detecting the fingerprint information.

Optionally, the invisible light emitting element 2 is an infrared light emitting diode, and the invisible light sensor 3 correspondingly includes an infrared light detecting phototransistor.

Optionally, the invisible light emitting element 2 is a near infrared light emitting diode, and the invisible light sensor 3 correspondingly includes a near infrared light detecting phototransistor.

In some embodiments, the phototransistor includes a first node connected to a sensor line, a second node connected to a first power supply terminal, and a gate node connected to a touch control signal terminal. Optionally, the phototransistor further includes an active layer. Optionally, the active layer includes one or a combination of gallium nitride (GaN), gallium arsenide (GaAs), indium phosphide (WP), and germanium silicon (GeSi). Optionally, the active layer is made of germanium silicon, which has a relatively wide detecting range. Optionally, the active layer is made of germanium silicon, and the phototransistor further includes a wavelength filter to selectively filter out light of certain wavelengths. Various appropriate methods may be used for making the active layer. In one example, the active layer may be formed by a magnetron sputtering process.

Referring to FIG. 1 and FIG. 2, the light shield 4 is in a same layer as the first electrode 21 and made of a same material as the first electrode 21. Moreover, the light shield 4 and the first electrode 21 constitute an integral layer, e.g., connected to each other. The via 41 in some embodiments abuts the first electrode 21. For example, a portion of the lateral side of the invisible light emitting element 2 (including lateral sides of the first electrode 21, the invisible light emitting layer 22, and the second electrode 23) constitutes a part of the boundary forming the via 41. By having the via 41 abutting the invisible light emitting element 2, more light reflected by the touch object F can be transmitted into the invisible light sensor 3, resulting in an enhanced sensitivity.

Figure 3:
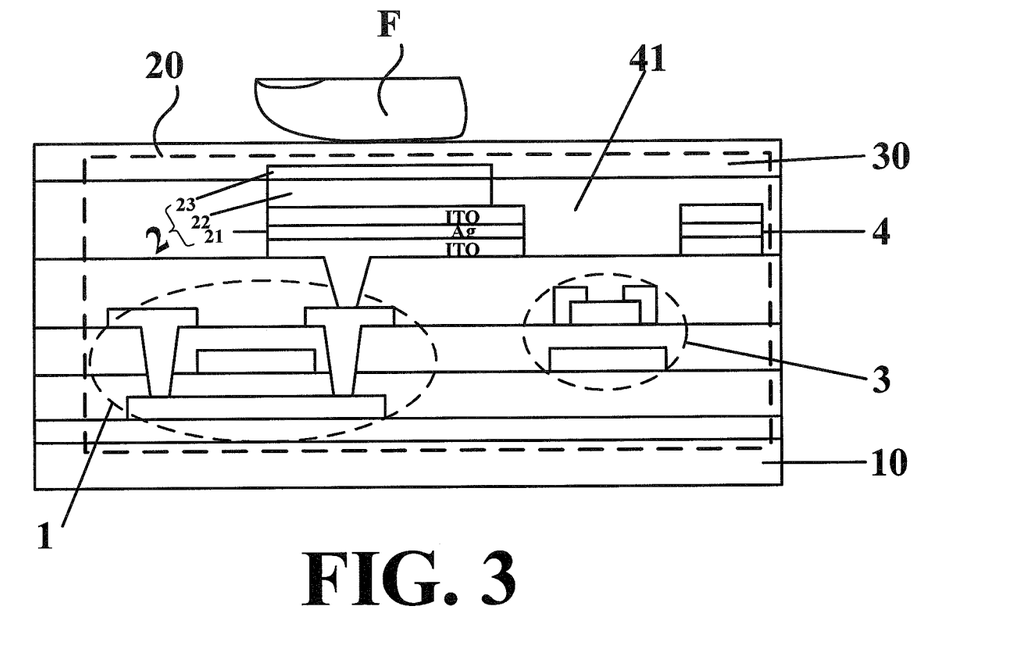
FIG. 3 is a diagram illustrating the structure of a fingerprint detection touch control display apparatus in some embodiments according to the present disclosure.
Figure 4:
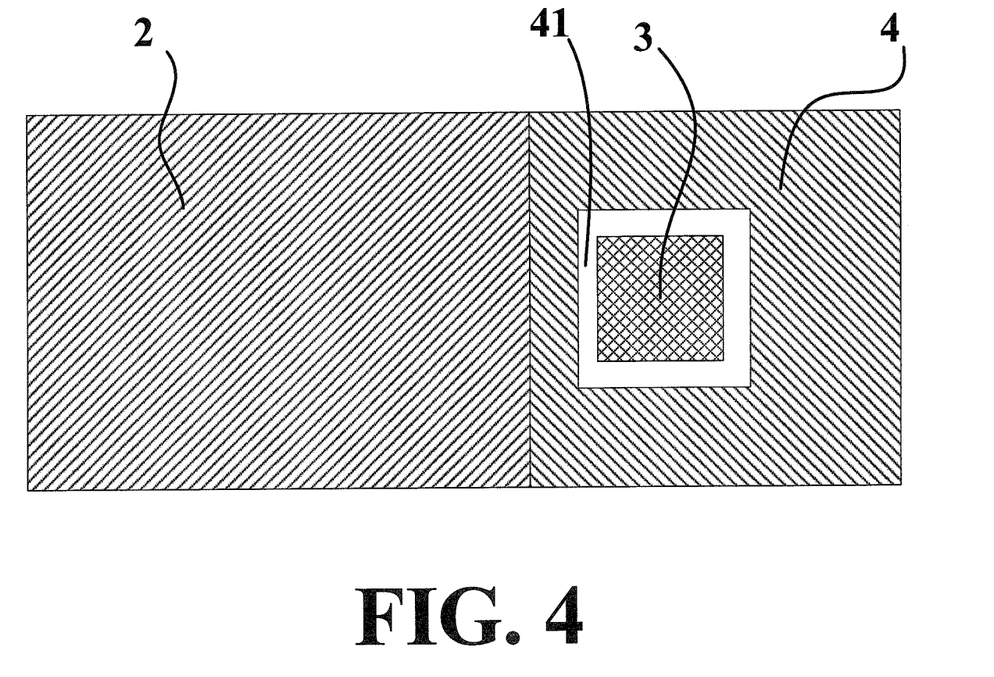
FIG. 4 is a plan view of an invisible light emitting element and a light shield of a touch sensor in FIG. 3.

FIG. 3 is a diagram illustrating the structure of a fingerprint detection touch control display apparatus in some embodiments according to the present disclosure. FIG. 4 is a plan view of an invisible light emitting element and a light shield of a touch sensor in FIG. 3. Referring to FIG. 3 and FIG. 4, the light shield 4 is in same layer as the first electrode 21 and made of a same material as the first electrode 21, the light shield 4 and the first electrode 21 constitute an integral layer, e.g., connected to each other. The via 41 does not abut the invisible light emitting element 2, e.g., the via 41 is spaced apart from the invisible light emitting element 2 by a portion of the light shield 4. The lateral side of the invisible light emitting element 2 does not constitute apart of the boundary forming the via 41.

Figure 5:
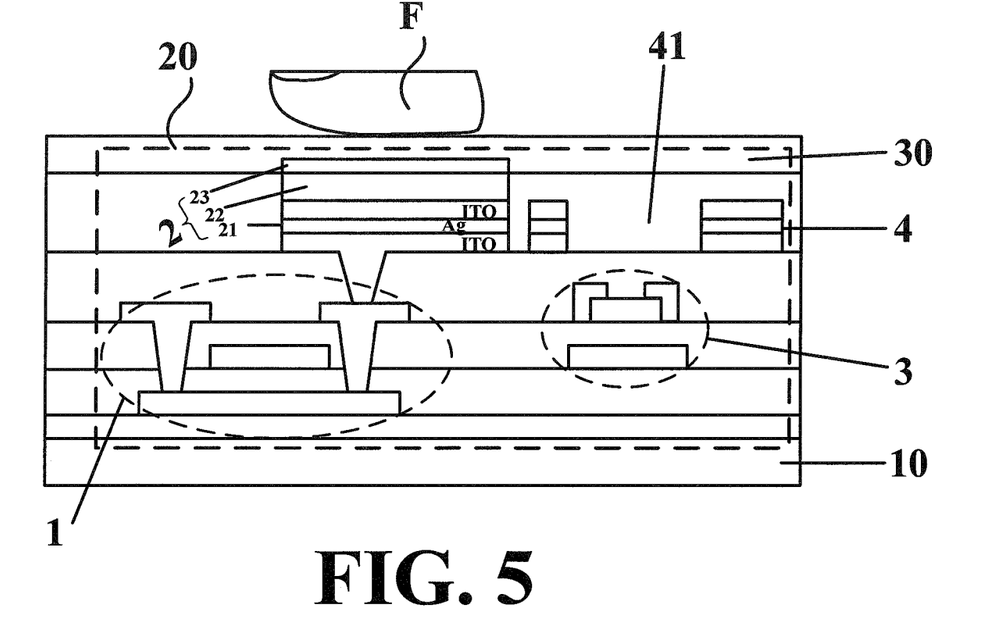
FIG. 5 is a diagram illustrating the structure of a fingerprint detection touch control display apparatus in some embodiments according to the present disclosure.
Figure 6:
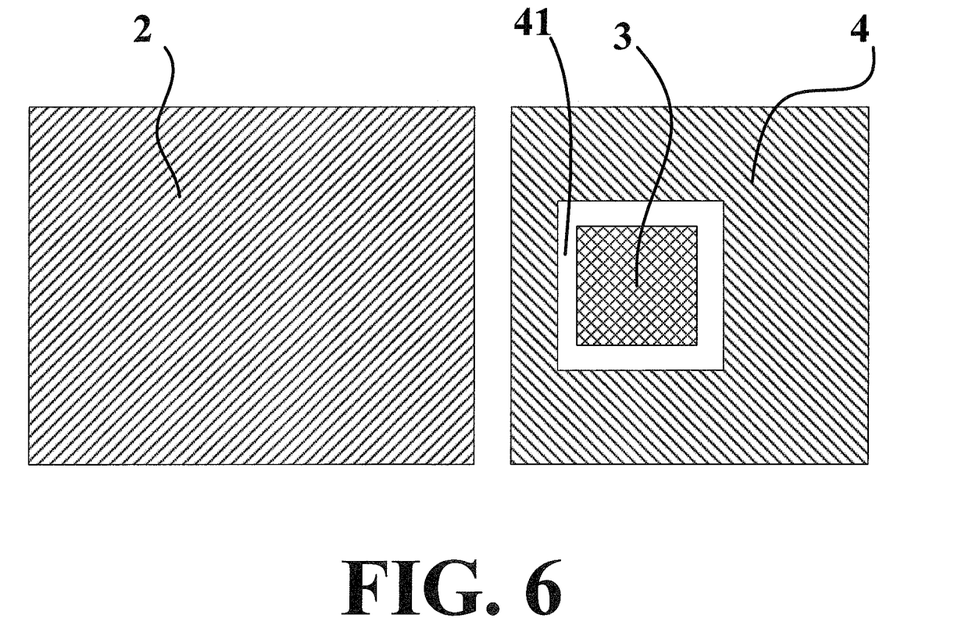
FIG. 6 is a plan view of an invisible light emitting element and a light shield of a touch sensor in FIG. 5.

FIG. 5 is a diagram illustrating the structure of a fingerprint detection touch control display apparatus in some embodiments according to the present disclosure. FIG. 6 is a plan view of an invisible light emitting element and a light shield of a touch sensor in FIG. 5. Referring to FIG. 5 and FIG. 6, the light shield 4 is in a same layer as the first electrode 21 and made of a same material as the first electrode 21. However, in some embodiments, the light shield 4 is spaced apart from the first electrode 21.

Figure 7:
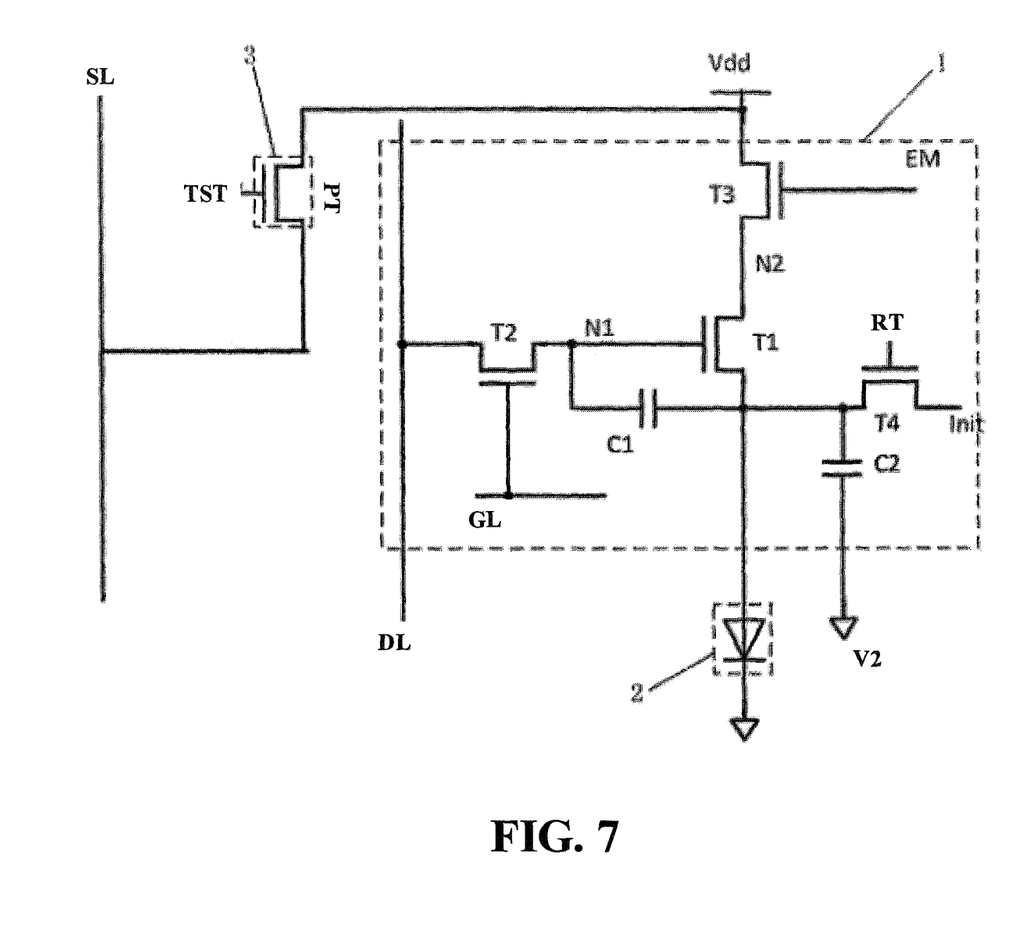
FIG. 7 is a circuit diagram of a driving circuit of a fingerprint detection touch control display apparatus in some embodiments according to the present disclosure.

FIG. 7 is a circuit diagram of a driving circuit of a fingerprint detection touch control display apparatus in some embodiments according to the present disclosure. Referring to FIG. 7, the driving circuit 1 in some embodiments includes a driving transistor T1, a switching transistor T2, a light emission control transistor T3, a reset transistor T4, a first storage capacitor C1, and a second storage capacitor C2. The driving transistor T1 includes a first node connected to a first power supply terminal Vdd, a second node connected to the invisible light emitting element 2, and a gate node connected to a data line DL. The switching transistor T2 includes a first node connected to the data line DL, a second node connected to the gate node of the driving transistor T1, and a gate node connected to a gate line GL. The light emission control transistor T3 includes a first node connected to the first power supply terminal Vdd, a second node connected to the first node of the driving transistor T1, and a gate node connected to an emission control line EM. The reset transistor T4 includes a first node connected to the second node of the driving transistor T1, a second node connected to a signal input terminal Init, and a gate node connected to a reset signal terminal RT. The first storage capacitor C includes a first terminal connected to the gate electrode of the driving transistor T1, and a second terminal connected to the second node of the driving transistor T1. The second storage capacitor C2 includes a first terminal connected to the first node of the reset transistor T4, and a second terminal connected to a second power supply terminal V2.

In some embodiments, the invisible light sensor 3 includes a phototransistor (e.g., a near infrared light detecting phototransistor), the driving transistor T1 is a top gate type transistor, and the phototransistor is a bottom gate type transistor. Optionally, the gate node of the driving transistor and a gate node of the near infrared light detecting phototransistor are in a same layer and comprises a same material, and can be patterned in a single patterning process using a single mask plate.

The invisible light sensor 3 in some embodiments includes a phototransistor PT, as shown in FIG. 7. The phototransistor PT in some embodiments includes a first node connected to the sensor line SL, a second node connected to the first power supply terminal Vdd, and a gate node connected to a touch control signal terminal TST.

Figure 8:
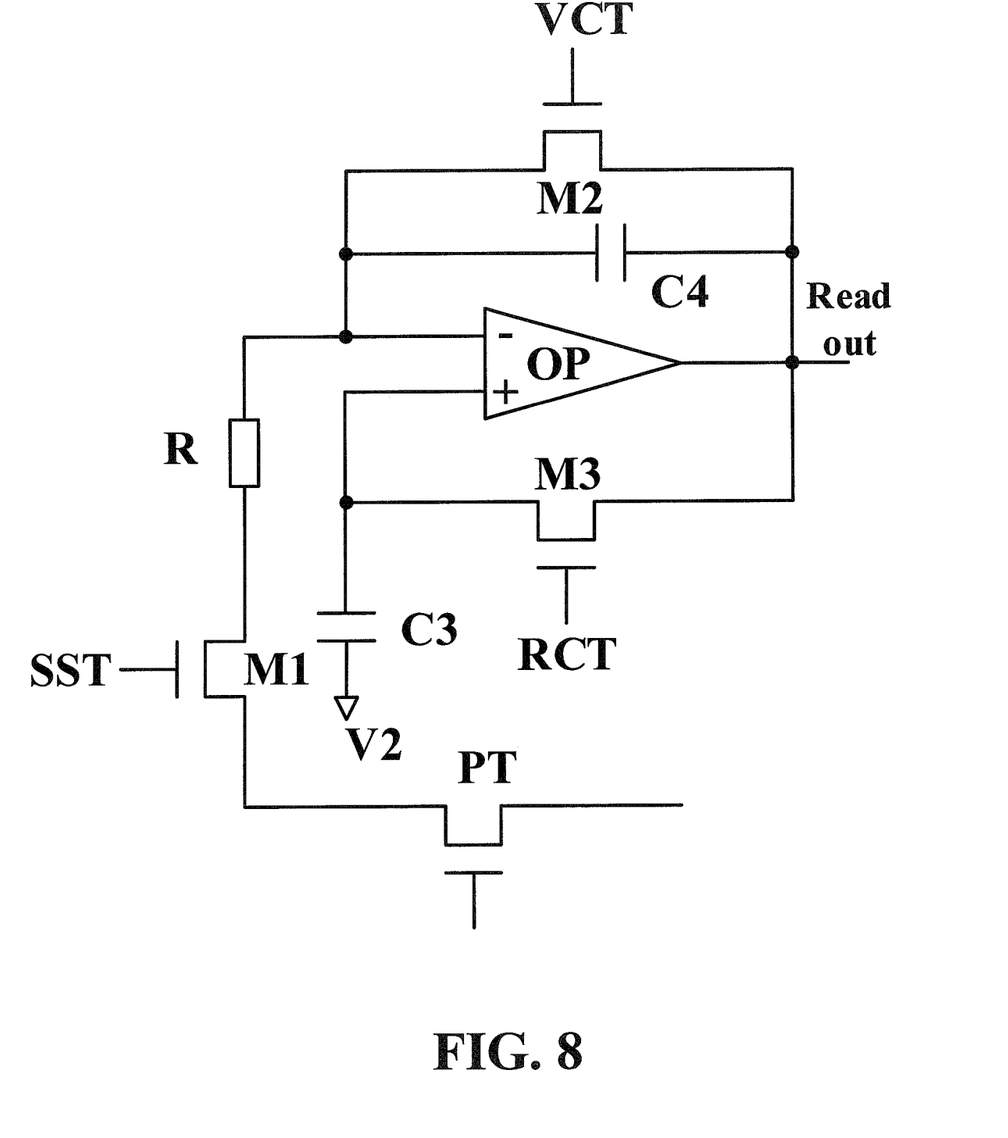
FIG. 8 is a circuit diagram of an operational amplification circuit of a fingerprint detection touch control display apparatus in some embodiments according to the present disclosure.

In some embodiments, each of the plurality of touch sensors 20 further includes an operational amplification circuit configured to amplify an electrical signal generated by the invisible light sensor 3 upon receiving the portion of the light. FIG. 8 is a circuit diagram of an operational amplification circuit of a fingerprint detection touch control display apparatus in some embodiments according to the present disclosure. Referring to FIG. 8, the operational amplification circuit in some embodiments includes a sampling switch transistor M1, a reference resistor R, a variable acquisition switching transistor M2, an integrating capacitor C4, an operational amplifier OP, a third storage capacitor C3, and a reset switching transistor M3. The sampling switch transistor M1 includes a first node connected to the invisible light sensor 3 (e.g., to the phototransistor PT), a second node connected to a first terminal of the reference resistor R, and a gate node connected to a sampling control signal terminal SST. The reference resistor R includes a first terminal connected to the second node of the sampling switch transistor M1, and a second terminal connected to an inverting input terminal of the operational amplifier OP. The variable acquisition switching transistor M2 includes a first node connected to the inverting input terminal of the operational amplifier OP and a first terminal of the integrating capacitor C4, a second node connected to an output terminal of the operational amplifier OP and a second terminal of the integrating capacitor C4, and a gate node connected to a variable acquisition control terminal VCT. The reset switching transistor M3 includes a first node connected to a non-inverting input terminal of the operational amplifier OP and a first terminal of the third storage capacitor C3, a second node connected to the output terminal of the operational amplifier OP, and a gate node connected to a reset control terminal RCT. The third storage capacitor C3 includes a first terminal connected to the first node of the reset switching transistor M3, and a second terminal connected to a second power supply terminal V2.

Figure 9:
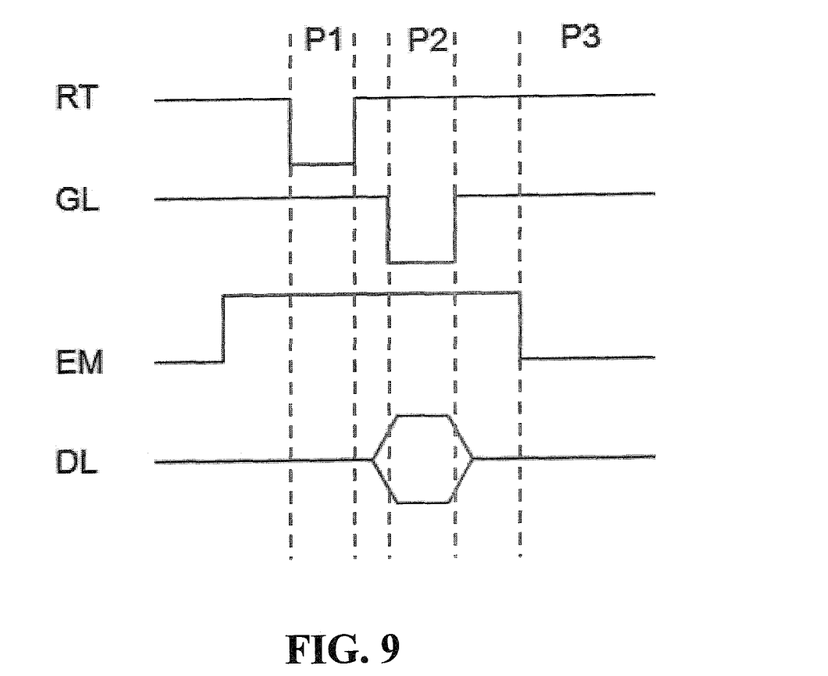
FIG. 9 is a timing diagram of the circuit diagram in FIG. 7.

FIG. 9 is a timing diagram of the circuit diagram in FIG. 7. Referring to FIG. 9, the driving process includes a rest period P1, a pre-charging period P2, and a light emission period P3. In the reset period P1, a low voltage level is provided to the reset signal terminal RT connected to the gate electrode of the reset transistor T4, thereby turning on the reset transistor T4. A reset signal is inputted to the invisible light emitting element 2 through the signal input terminal Init, thereby resetting the invisible light emitting element 2.

In the pre-charging period P2, a low voltage level signal is provided to the gate line GL to turn on the switching transistor T2. A high voltage level signal is provided to the emission control line EM, to turn off the driving transistor T1 and the light emission control transistor T3. A data voltage signal is provided to the data line DL, charging the first storage capacitor C1. The data voltage signal is written into the N1 node (referring to FIG. 7).

In the light emission period P3, the signal provided to the emission control line EM is switched from a high voltage level to a low voltage level, to turn on the driving transistor T1. A first power supply voltage provided through the first power supply terminal Vdd is written into the N2 node (referring to FIG. 7). Based on the voltage signal of the first storage capacitor C1, a current flow through the light emission control transistor T3 can be controlled, thereby controlling light emission of the invisible light emitting element 2.

In some embodiments, when the fingerprint detection touch control display apparatus is in an awake state, the invisible light emitting element 2 is configured to be turned on to emit an invisible light, e.g., an infrared light or a near infrared light. The phototransistor (e.g., an infrared light detecting phototransistor or a near infrared light detecting phototransistor) detects a dark current $I_0$. When a touch object such as a finger touches on the counter substrate 30, the phototransistor detects a portion of light reflected by the touch object F into the phototransistor through the via 41, generating a $\Delta I$ signal, indicating that the area corresponding to the phototransistor is covered by the touch object. In area absent of the touch object, the $\Delta I$ signal is substantially zero. Based on the electrical signal $\Delta I$ generated by the invisible light sensor upon receiving the portion of the light, fingerprint of the touch object can be recognized.

In some embodiments, when the fingerprint detection touch control display apparatus is in a sleep state, the invisible light emitting element 2 is configured to be turned on to emit an invisible light, e.g., an infrared light or a near infrared light. Optionally, the fingerprint detection touch control display apparatus can be kept normally on with a reduced refresh frequency. With the reduced refresh frequency, energy consumption of the fingerprint detection touch control display apparatus can be reduced. The phototransistor (e.g., an infrared light detecting phototransistor or a near infrared light detecting phototransistor) detects a dark current $I_0'$ (corresponding to the sleep state). When a touch object such as a finger touches on the counter substrate 30, the phototransistor detects a portion of light reflected by the touch object F into the phototransistor through the via 41, generating a $\Delta I'$ signal, indicating that the area corresponding to the phototransistor is covered by the touch object. Based on the electrical signal $\Delta I'$ generated by the invisible light sensor upon receiving the portion of the light, fingerprint of the touch object can be recognized. Moreover, based on the electrical signal $\Delta I'$, the display panel of the fingerprint detection touch control display apparatus can be woken up.

In some embodiments, the portion of light reflected by the touch object F is approximately 10% of the total light emitted from the invisible light emitting element 2. The phototransistor is highly responsive to a small input, particularly suitable for making the invisible light sensor in the present disclosure. Moreover, the dark current of the phototransistor can be readily adjusted by adjusting the gate electrode voltage, further enhancing the responsiveness of the phototransistor. A touch sensor panel can be made according to the present disclosure.

In some embodiments, absent of a touch, the phototransistor includes a first node connected to a sensor line. Referring to FIG. 8, when the phototransistor is turned on, a reference voltage Vref is written into the phototransistor through the sensor line. First, the reset switching transistor M3 is turned on, and the reference voltage Vref is written into the third storage capacitor C3. Subsequently, the reset switching transistor M3 is then turned off, the current from the phototransistor charges the integrating capacitor C4 for a charging duration t. Because the voltage level between the reference resist R and the integrating capacitor C4 is Vref, it follows that $$(V_{ref} - V_{readout}) \times C = \int_0^{\tau} I dt. \tag{1}$$

In some embodiments, when a touch occurs, the touch object (e.g., a finger) reflects the light emitted from the invisible light emitting element 2. Upon receiving the reflected light, a photocurrent generated by the phototransistor increases by ΔI, it follows that $$(V_{ref} - V'_{readout}) \times C = \int_0^{\tau} (I - \Delta I) dt. \tag{2}$$

Based on Equation (1) and Equation (2) above, it can be derived that:

$$(V_{readout} - V'_{readout}) \times C = \int_0^{\tau} \Delta I dt. \tag{3}$$

Based on Equation (3), a magnitude of the photo-generated current can be obtained. Based on positions of a plurality of phototransistors in the fingerprint detection touch control display apparatus and the magnitudes of the photo-generated currents corresponding to the plurality of phototransistors respectively.

In some embodiments, absent of a touch, the phototransistor is turned on. At the same time, the sampling switch transistor M is also turned on, a voltage V1 at the inverting input terminal of the operational amplifier OP is induced by the reference resistor R. The variable acquisition switching transistor M2 and the reset transistor M3 are both turned on. The inverting input terminal and the non-inverting input terminal of the operational amplifier OP both obtain the basic information (V1) of the phototransistor. The dark current of the phototransistor can be detected at this time, and a voltage level $V_{out1}$ can be read:

$$V_{out1} = \frac{1}{C} \int_0^{\tau} I(t) dt. \tag{4}$$

In some embodiments, the sampling control signal is provided, the switching transistor T2 is turned on, the variable acquisition switching transistor M2 and the reset transistor M3 are both turned on. The photocurrent increases to (I+I'). The voltage level $V_{out2}$ at this time corresponding to the increased photocurrent can be calculated based on:

$$V_{out2} = V_{out1} + \frac{1}{C} \int_0^{\tau} [I(t) + I'(t)] dt. \tag{5}$$

Equation (5) can be converted into Equation (6):

$$V_{out2} = V_{out1} + V_{out1} + \frac{1}{C} \int_0^{\tau} I'(t) dt. \tag{6}$$

Accordingly, the photocurrent change ΔI can be calculated based on Equation (7):

$$\int_0^{\tau} I'(t) dt = (V_{out2} - 2V_{out1}) C. \tag{7}$$

Based on the photocurrent change ΔI, fingerprint information of the touch object can be obtained.

Figure 10:
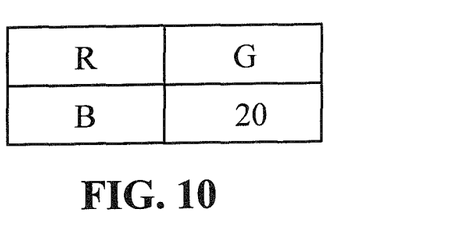
FIGS. 10 to 12 illustrates various exemplary subpixel arrangements of a fingerprint detection touch control display apparatus in some embodiments according to the present disclosure.
Figure 11:
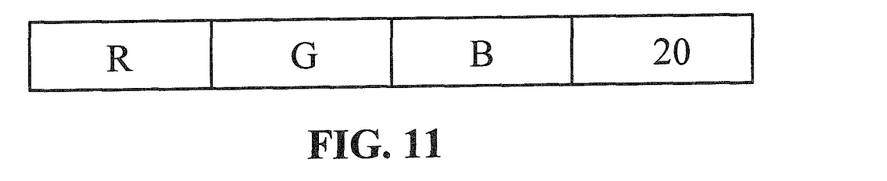
Figure 12:
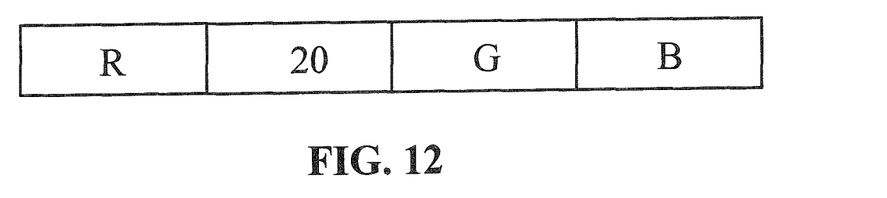

In some embodiments, the fingerprint detection touch control display apparatus further includes a plurality of pixels for image display. Optionally, the plurality of touch sensor are disposed in multiple ones of the plurality of pixels. Each of the plurality of touch sensors 20 may be disposed between any two adjacent subpixels. Optionally, each of the plurality of pixels includes one of the plurality of touch sensors. Optionally, each of the plurality of pixels includes at least one subpixel. Optionally, each of the plurality of pixels includes a plurality of subpixels of different colors. In one example, each of the plurality of pixels includes a red subpixel, a green subpixel, and a blue subpixel. Optionally, each of the plurality of subpixels includes a visible light emitting element such as a visible light emitting organic light emitting diode. Optionally, the plurality of pixels are arranged in an army. FIGS. 10 to 12 illustrates various exemplary subpixel arrangements of a fingerprint detection touch control display apparatus in some embodiments according to the present disclosure.

In some embodiments, the fingerprint detection touch control display apparatus further includes an image display status monitor configured to monitor an image display status of the fingerprint detection touch control display apparatus; and a fingerprint reader configured to recognize a fingerprint of a touch object. Optionally, when the image display status monitor detects that the fingerprint detection touch control display apparatus is in a sleep state, the fingerprint reader is configured to wake up the fingerprint detection touch control display apparatus and recognize the fingerprint of the touch object. Optionally, when the image display status monitor detects that the fingerprint detection touch control display apparatus is in an image display state, the fingerprint reader is configured to recognize the fingerprint of the touch object based on an electrical signal generated by the invisible light sensor upon receiving the portion of the light.

In some embodiments, the fingerprint detection touch control display apparatus further includes a refresh frequency adjustor configured to adjust a refresh frequency of the fingerprint detection touch control display apparatus. Optionally, when the image display status monitor detects that the fingerprint detection touch control display apparatus is in a sleep state, the refresh frequency adjustor is configured to set the refresh frequency of the fingerprint detection touch control display apparatus to a first refresh frequency. Optionally, when the image display status monitor detects that the fingerprint detection touch control display apparatus is in an image display state, the refresh frequency adjustor is configured to set the refresh frequency of the fingerprint detection touch control display apparatus to a second refresh frequency greater than the first refresh frequency.

In some embodiments, the fingerprint detection touch control display apparatus further includes a memory; and one or more processors. The memory and the one or more processors are connected with each other. The memory stores computer-executable instructions for controlling the one or more processors to monitor an image display status of the fingerprint detection touch control display apparatus; and recognize a fingerprint of a touch object. Optionally, when the fingerprint detection touch control display apparatus is detected to be in a sleep state, the memory further stores computer-executable instructions for controlling the one or more processors to wake up the fingerprint detection touch control display apparatus and recognize the fingerprint of the touch object. Optionally, when the fingerprint detection touch control display apparatus is detected to be in an image display state, the memory further stores computer-executable instructions for controlling the one or mom processors to recognize the fingerprint of the touch object based on an electrical signal generated by the invisible light sensor upon receiving the portion of the light.

In some embodiments, the memory further stores computer-executable instructions for controlling the one or more processors to adjust a refresh frequency of the fingerprint detection touch control display apparatus. Optionally, when the fingerprint detection touch control display apparatus is detected to be in a sleep state, the memory further stores computer-executable instructions for controlling the one or more processors to set the refresh frequency of the fingerprint detection touch control display apparatus to a first refresh frequency. Optionally, when the fingerprint detection touch control display apparatus is detected to be in an image display state, the mm y further stores computer-executable instructions for controlling the one or more processors to set the refresh frequency of the fingerprint detection touch control display apparatus to a second refresh frequency greater than the first refresh frequency.

Various appropriate light emitting elements may be used in the present display substrate. Examples of appropriate light emitting elements include an organic light emitting diode, a quantum dots light emitting diode, and a micro light emitting diode.

Examples of appropriate fingerprint detection touch control display apparatuses include, but are not limited to, an electronic paper, a mobile phone, a tablet computer, a television, a monitor, a notebook computer, a digital album, a PS, etc.

In another aspect, the present disclosure provides an array substrate. In some embodiments, the array substrate includes a base substrate; and a plurality of touch sensors on the base substrate. Optionally, each of the plurality of touch sensors includes an invisible light emitting element; a driving circuit configured to driving light emission of the invisible light emitting element; an invisible light sensor; and a light shield. Optionally, the invisible light emitting element is configured to emit light, at least a portion of the light being reflected by a touch object into the invisible light sensor through a via extending through the light shield. Optionally, the invisible light sensor is configured to detect the portion of the light, thereby detecting a fingerprint information.

In some embodiments, the invisible light emitting element includes a first electrode; an invisible light emitting layer on the first electrode; and a second electrode on a side of the light emitting layer away from the first electrode. Optionally, the light shield is in a same layer as the first electrode and made of a same material. Optionally, the second electrode is a common electrode for the plurality of touch sensors and configured to provide a common voltage level for the plurality of touch sensors. Optionally, the second electrode is absent in a region above the via. Optionally, the invisible light sensor is at a position corresponding to the via, and an orthographic projection of the invisible light sensor n the base substrate is at least partially between an orthographic projection of the invisible light emitting element on the base substrate and an orthographic projection of the light shield on the base substrate.

In some embodiments, the invisible light sensor comprises a near infrared light detecting phototransistor including a first node connected to a sensor line, a second node connected to a fast power supply terminal, and a gate node connected to a touch control signal terminal. Optionally, the phototransistor further includes an active layer made of a material selected from a group consisting of gallium nitride (GaN), gallium arsenide (GaAs), indium phosphide (InP), and germanium silicon (GeSi). Optionally, the invisible light emitting element is an infrared light emitting element or a near infrared light mitting element.

In some embodiments, the driving circuit includes a driving transistor comprising a first node connected to a first power supply terminal, a second node connected to the invisible light emitting element, and a gate node connected to a data line. Optionally, the driving circuit further includes a switching transistor, a light emission control transistor, a reset transistor, a first storage capacitor, and a second storage capacitor. Optionally, the switching transistor includes a first node connected to the data line, a second node connected to the gate node of the driving transistor, and a gate node connected to a gate line. Optionally, the light emission control transistor includes a first node connected to the first power supply terminal, a second node connected to the first node of the driving transistor, and a gate node connected to an emission control line. Optionally, the reset transistor includes a first node connected to the second node of the driving transistor, a second node connected to a signal input terminal, and a gate node connected to a reset signal terminal. Optionally, the first storage capacitor includes a first terminal connected to the gate electrode of the driving transistor, and a second terminal connected to the second node of the driving transistor. Optionally, the second storage capacitor includes a first terminal connected to the first node of the reset transistor, and a second terminal connected to a second power supply terminal.

In some embodiments, the array substrate further includes an operational amplification circuit configured to amplify an electrical signal generated by the invisible light sensor upon receiving the portion of the light. Optionally, the operational amplification circuit includes a sampling switch transistor, a reference resistor, a variable acquisition switching transistor, an integrating capacitor, an operational amplifier, a third storage capacitor, and a reset switching transistor. Optionally, the sampling switch transistor comprises a first node connected to the invisible light sensor, a second node connected to a first terminal of the reference resistor, and a gate node connected to a sampling control signal terminal. Optionally, the reference resistor comprises a first terminal connected to the second node of the sampling switch transistor, and a second terminal connected to an inverting input terminal of the operational amplifier. Optionally, the variable acquisition switching transistor comprises a first node connected to the inverting input terminal of the operational amplifier and a first terminal of the integrating capacitor, a second node connected to an output terminal of the operational amplifier and a second terminal of the integrating capacitor, and a gate node connected to a variable acquisition control terminal. Optionally, the reset transistor comprises a first node connected to anon-inverting input terminal of the operational amplifier and a first terminal of the third storage capacitor, a second node connected to the output terminal of the operational amplifier, and a gate node connected to a reset control terminal. Optionally, the third storage capacitor comprises a first terminal connected to the first node of the reset transistor, and a we terminal connected to a second power supply terminal.

In another aspect, the present disclosure provides a method of fabricating a fingerprint detection touch control display apparatus. In some embodiments, the method includes forming a plurality of touch sensors on a base substrate; and forming a counter substrate facing the base substrate. Optionally, forming each of the plurality of touch sensors includes forming an invisible light emitting element; forming a driving circuit configured to driving light emission of the invisible light emitting element forming an invisible light sensor; forming a light shield; and forming a via extending through the light shield. Optionally, the invisible light emitting element is formed to emit light toward the counter substrate, at least a portion of the light being reflected by a touch object into the invisible light sensor through the via. Optionally, the invisible light sensor is formed to detect the portion of the light, thereby detecting a fingerprint information.

In some embodiments, the step of forming the invisible light emitting element includes forming a first electrode material layer; patterning the first electrode material layer using a single mask plate to form a first electrode, the light shield, and the via, the light shield and the first electrode formed in a same layer using a single mask plate, and the via formed to extend through the light shield; forming an invisible light emitting layer on the first electrode; and forming a second electrode on a side of the light emitting layer away from the first electrode.

In some embodiments, the step of forming the second electrode includes depositing a second electrode material layer on a side of the light emitting layer away from the first electrode in an open mask process; and patterning the second electrode material layer to remove a portion of the second electrode material in a region above the via, thereby forming the second electrode layer.

In another aspect, the present disclosure provides a method of fabricating an array substrate. In some embodiments, the method includes forming a plurality of touch sensors on a base substrate. Optionally, forming each of the plurality of touch sensors includes forming an invisible light emitting element; forming a driving circuit configured to driving light emission of the invisible light emitting element; forming an invisible light sensor; forming a light shield; and forming a via extending through the light shield. Optionally, the invisible light emitting element is formed to emit light, at least a portion of the light being reflected by a touch object into the invisible light sensor through the via. Optionally, the invisible light sensor is formed to detect the portion of the light, thereby detecting a fingerprint information.

In some embodiments, the step of forming the invisible light emitting element includes forming a first electrode material layer; patterning the first electrode material layer using a single mask plate to form a first electrode, the light shield, and the via, the light shield and the first electrode formed in a same layer using a single mask plate, and the via formed to extend through the light shield; forming an invisible light emitting layer on the first electrode; and forming a second electrode on a side of the light emitting layer away from the first electrode.

In some embodiments, the step of forming the second electrode includes depositing a second electrode material layer on a side of the light emitting layer away from the first electrode in an open mask process and patterning the second electrode material layer to remove a portion of the second electrode material in a region above the via, thereby forming the second electrode layer.

The foregoing description of the embodiments of the invention has been presented for purposes of illustration and description. It is not intended to be exhaustive or to limit the invention to the precise form or to exemplary embodiment disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as me suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claim. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A fingerprint detection touch control display apparatus, comprising:
   a base substrate;
   a plurality of touch sensors on the base substrate; and
   a counter substrate facing the base substrate;
   wherein each of the plurality of touch sensors comprises:
   an invisible light emitting element;
   a driving circuit configured to driving light emission of the invisible light emitting element;
   an invisible light sensor; and
   a light shield; and
   wherein the invisible light emitting element is configured to emit light toward the counter substrate, at least a portion of the light being reflected by a touch object on the counter substrate into the invisible light sensor through a via extending through the light shield; and
   the invisible light sensor is configured to detect the portion of the light, thereby detecting a fingerprint information;
   wherein the driving circuit comprises a switching transistor, a light emission control transistor, a reset transistor, a first storage capacitor, and a second storage capacitor;

wherein the switching transistor comprises a first node connected to a data line, a second node connected to a gate node of a driving transistor, and a gate node connected to a gate line;

the light emission control transistor comprises a first node connected to a first power supply terminal, a second node connected to the first node of the driving transistor, and a gate node connected to an emission control line;

the reset transistor comprises a first node connected to the second node of the driving transistor, a second node connected to a signal input terminal, and a gate node connected to a reset signal terminal;

the first storage capacitor comprises a first terminal connected to the gate node of the driving transistor, and a second terminal connected to the second node of the driving transistor; and the second storage capacitor comprises a first terminal connected to the first node of the reset transistor, and a second terminal connected to a second power supply terminal.

2. The fingerprint detection touch control display apparatus of claim 1, wherein the invisible light emitting element comprises:
a first electrode;
an invisible light emitting layer on the first electrode; and
a second electrode on a side of the invisible light emitting layer away from the first electrode;
wherein the light shield is in a same layer as the first electrode and made of a same material.

3. The fingerprint detection touch control display apparatus of claim 2, wherein the second electrode is a common electrode for the plurality of touch sensors and configured to provide a common voltage level for the plurality of touch sensors; and
the second electrode is absent in a region above the via.

4. The fingerprint detection touch control display apparatus of claim 1, wherein the invisible light sensor is at a position corresponding to the via; and
an orthographic projection of the invisible light sensor on the base substrate is at least partially between an orthographic projection of the invisible light emitting element on the base substrate and an orthographic projection of the light shield on the base substrate.

5. The fingerprint detection touch control display apparatus of claim 1, wherein the invisible light sensor comprises a near infrared light detecting phototransistor comprising a first node connected to a sensor line, a second node connected to a first power supply terminal, and a gate node connected to a touch control signal terminal.

6. The fingerprint detection touch control display apparatus of claim 5, wherein the near infrared light detecting phototransistor further comprises an active layer made of a material selected from a group consisting of gallium nitride (GaN), gallium arsenide (GaAs), indium phosphide (InP), and germanium silicon (GeSi).

7. The fingerprint detection touch control display apparatus of claim 1, wherein the invisible light emitting element is an infrared light emitting element or a near infrared light emitting element.

8. The fingerprint detection touch control display apparatus of claim 1, wherein the driving circuit further comprises the driving transistor comprising a first node connected to the first power supply terminal, a second node connected to the invisible light emitting element, and a gate node connected to the data line.

9. The fingerprint detection touch control display apparatus of claim 1, further comprising an operational amplification circuit configured to amplify an electrical signal generated by the invisible light sensor upon receiving the portion of the light.

10. The fingerprint detection touch control display apparatus of claim 9, wherein the operational amplification circuit comprises a sampling switch transistor, a reference resistor, a variable acquisition switching transistor, an integrating capacitor, an operational amplifier, a third storage capacitor, and a reset switching transistor;
wherein the sampling switch transistor comprises a first node connected to the invisible light sensor, a second node connected to a first terminal of the reference resistor, and a gate node connected to a sampling control signal terminal;
the reference resistor comprises a first terminal connected to the second node of the sampling switch transistor, and a second terminal connected to an inverting input terminal of the operational amplifier;
the variable acquisition switching transistor comprises a first node connected to the inverting input terminal of the operational amplifier and a first terminal of the integrating capacitor, a second node connected to an output terminal of the operational amplifier and a second terminal of the integrating capacitor, and a gate node connected to a variable acquisition control terminal;
the reset switching transistor comprises a first node connected to a non-inverting input terminal of the operational amplifier and a first terminal of the third storage capacitor, a second node connected to the output terminal of the operational amplifier, and a gate node connected to a reset control terminal; and
the third storage capacitor comprises a first terminal connected to the first node of the reset switching transistor, and a second terminal connected to a second power supply terminal.

11. The fingerprint detection touch control display apparatus of claim 1, comprising a plurality of pixels;
wherein the plurality of touch sensors are disposed in multiple ones of the plurality of pixels.

12. The fingerprint detection touch control display apparatus of claim 1, further comprising:
a memory; and
one or more processors;
wherein the memory and the one or more processors are connected with each other; and
the memory stores computer-executable instructions for controlling the one or more processors to:
monitor an image display status of the fingerprint detection touch control display apparatus; and
recognize a fingerprint of a touch object.

13. The fingerprint detection touch control display apparatus of claim 12, wherein, when the fingerprint detection touch control display apparatus is detected to be in a sleep state, the memory further stores computer-executable instructions for controlling the one or more processors to wake up the fingerprint detection touch control display apparatus and recognize the fingerprint of the touch object; and
when the fingerprint detection touch control display apparatus is detected to be in an image display state, the memory further stores computer-executable instructions for controlling the one or more processors to recognize the fingerprint of the touch object based on an electrical signal generated by the invisible light sensor upon receiving the portion of the light.

14. The fingerprint detection touch control display apparatus of claim 12, wherein the memory further stores computer-executable instructions for controlling the one or more processors to adjust a refresh frequency of the fingerprint detection touch control display apparatus.

15. The fingerprint detection touch control display apparatus of claim 14, wherein, when the fingerprint detection touch control display apparatus is detected to be in a sleep state, the memory further stores computer-executable instructions for controlling the one or more processors to set the refresh frequency of the fingerprint detection touch control display apparatus to a first refresh frequency; and
when the fingerprint detection touch control display apparatus is detected to be in an image display state, the memory further stores computer-executable instructions for controlling the one or more processors to set the refresh frequency of the fingerprint detection touch control display apparatus to a second refresh frequency greater than the first refresh frequency.

16. A method of fabricating a fingerprint detection touch control display apparatus, comprising:
forming a plurality of touch sensors on a base substrate; and
forming a counter substrate facing the base substrate;
wherein forming each of the plurality of touch sensors comprises:
forming an invisible light emitting element;
forming a driving circuit configured to driving light emission of the invisible light emitting element;
forming an invisible light sensor;
forming a light shield; and
forming a via extending through the light shield;
wherein the invisible light emitting element is formed to emit light toward the counter substrate, at least a portion of the light being reflected by a touch object into the invisible light sensor through the via; and
the invisible light sensor is formed to detect the portion of the light, thereby detecting a fingerprint information;
wherein forming the driving circuit comprises forming a switching transistor, forming a light emission control transistor, forming a reset transistor, forming a first storage capacitor, and forming a second storage capacitor;
wherein the switching transistor comprises a first node connected to a data line, a second node connected to a gate node of a driving transistor, and a gate node connected to a gate line;
the light emission control transistor comprises a first node connected to a first power supply terminal, a second node connected to the first node of the driving transistor, and a gate node connected to an emission control line;
the reset transistor comprises a first node connected to the second node of the driving transistor, a second node connected to a signal input terminal, and a gate node connected to a reset signal terminal;
the first storage capacitor comprises a first terminal connected to the gate node of the driving transistor, and a second terminal connected to the second node of the driving transistor; and
the second storage capacitor comprises a first terminal connected to the first node of the reset transistor, and a second terminal connected to a second power supply terminal.

17. The method of claim 16, wherein forming the invisible light emitting element comprises:
forming a first electrode material layer;
patterning the first electrode material layer using a single mask plate to form a first electrode, the light shield, and the via, the light shield and the first electrode formed in a same layer using a single mask plate, and the via formed to extend through the light shield;
forming an invisible light emitting layer on the first electrode; and
forming a second electrode on a side of the light emitting layer away from the first electrode.

18. The method of claim 17, wherein forming the second electrode comprises:
depositing a second electrode material layer on a side of the light emitting layer away from the first electrode in an open mask process; and
patterning the second electrode material layer to remove a portion of the second electrode material layer in a region above the via, thereby forming the second electrode.

19. An array substrate, comprising:
a base substrate; and
a plurality of touch sensors on the base substrate;
wherein each of the plurality of touch sensors comprises:
an invisible light emitting element;
a driving circuit configured to driving light emission of the invisible light emitting element;
an invisible light sensor; and
a light shield; and
wherein the invisible light emitting element is configured to emit light, at least a portion of the light being reflected by a touch object into the invisible light sensor through a via extending through the light shield; and
the invisible light sensor is configured to detect the portion of the light, thereby detecting a fingerprint information;
wherein the driving circuit comprises a switching transistor, a light emission control transistor, a reset transistor, a first storage capacitor, and a second storage capacitor;
wherein the switching transistor comprises a first node connected to a data line, a second node connected to a gate node of a driving transistor, and a gate node connected to a gate line;
the light emission control transistor comprises a first node connected to a first power supply terminal, a second node connected to the first node of the driving transistor, and a gate node connected to an emission control line;
the reset transistor comprises a first node connected to the second node of the driving transistor, a second node connected to a signal input terminal, and a gate node connected to a reset signal terminal;
the first storage capacitor comprises a first terminal connected to the gate node of the driving transistor, and a second terminal connected to the second node of the driving transistor; and
the second storage capacitor comprises a first terminal connected to the first node of the reset transistor, and a second terminal connected to a second power supply terminal.

* * * * *